United States Patent
Tsuchiya et al.

(10) Patent No.: US 7,215,304 B2
(45) Date of Patent: May 8, 2007

(54) DISPLAY APPARATUS IN WHICH CHARACTERISTICS OF A PLURALITY OF TRANSISTORS ARE MADE TO DIFFER FROM ONE ANOTHER

(75) Inventors: Hiroshi Tsuchiya, Hirakata (JP); Yukihiro Noguchi, Gifu (JP); Shoichiro Matsumoto, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 92 days.

(21) Appl. No.: 10/359,571

(22) Filed: Feb. 7, 2003

(65) Prior Publication Data

US 2003/0156084 A1 Aug. 21, 2003

(30) Foreign Application Priority Data

Feb. 18, 2002 (JP) ............................. 2002-039954
Jan. 10, 2003 (JP) ............................. 2003-004242

(51) Int. Cl.
G09G 3/30 (2006.01)

(52) U.S. Cl. ........................... 345/76; 345/77; 345/78; 345/79; 345/81

(58) Field of Classification Search ............ 345/76–92, 345/211, 204, 48, 55; 235/462.11; 438/687; 340/815.45; 349/110; 315/169.3, 167, 169.4; 313/497; 257/72; 327/108
See application file for complete search history.

(56) References Cited

U.S. PATENT DOCUMENTS

| | | | |
|---|---|---|---|
| 3,662,210 A | 5/1972 | Maximov | |
| 5,517,080 A | 5/1996 | Budzilek et al. | |
| 5,780,351 A | 7/1998 | Arita et al. | |
| 5,945,008 A | 8/1999 | Kisakibaru et al. | |
| 6,075,319 A | 6/2000 | Kanda et al. | |
| 6,093,934 A | 7/2000 | Yamazaki et al. | |
| 6,124,604 A | 9/2000 | Koyama et al. | |
| 6,229,508 B1 * | 5/2001 | Kane | 345/82 |
| 6,281,552 B1 | 8/2001 | Kawasaki et al. | |
| 6,333,528 B1 | 12/2001 | Arita et al. | |
| 6,356,029 B1 | 3/2002 | Hunter | |
| 6,400,349 B1 | 6/2002 | Nagumo | 264/325 |
| 6,426,744 B2 * | 7/2002 | Hashimoto et al. | 345/214 |
| 6,489,046 B1 | 12/2002 | Ikeda et al. | |
| 6,498,438 B1 * | 12/2002 | Edwards | 315/169.3 |

(Continued)

FOREIGN PATENT DOCUMENTS

CN 1214799 A 4/1999

(Continued)

OTHER PUBLICATIONS

"Al-Mo (Aluminum-Molybdenum)" L. Brewer et al., *Binary Alloy Phase Diagrams* vol. 1 ed. Thaddeus B. Massalski, (Dec. 1980) pp. 133-134.

*Primary Examiner*—Bipin Shalwala
*Assistant Examiner*—Prabodh Dharia
(74) *Attorney, Agent, or Firm*—McDermott Will & Emery LLP

(57) ABSTRACT

A characteristic of a driving transistor which drives a diode is made to differ in terms of current driving capability from that of a switching transistor. The current driving capability of the driving transistor is made lower than that of the switching transistor.

18 Claims, 10 Drawing Sheets

U.S. PATENT DOCUMENTS

| | | |
|---|---|---|
| 6,501,466 B1 | 12/2002 | Yamagishi et al. |
| 6,525,704 B1 | 2/2003 | Kondo et al. |
| 6,528,824 B2 | 3/2003 | Yamagata et al. |
| 6,579,787 B2 | 6/2003 | Okura et al. |
| 6,583,581 B2 | 6/2003 | Kaneko et al. |
| 6,636,284 B2 * | 10/2003 | Sato ............................ 349/110 |
| 6,686,693 B1 | 2/2004 | Ogawa |
| 6,717,181 B2 | 4/2004 | Murakami et al. |
| 6,734,836 B2 | 5/2004 | Nishitoba .................... 345/82 |
| 6,753,834 B2 * | 6/2004 | Mikami et al. ............... 345/76 |
| 6,781,567 B2 * | 8/2004 | Kimura ........................ 345/92 |
| 6,911,784 B2 * | 6/2005 | Sasaki et al. ............. 315/169.4 |
| 6,989,826 B2 * | 1/2006 | Kasai ......................... 345/204 |
| 2001/0013851 A1 * | 8/2001 | Hashimoto et al. ........... 345/91 |
| 2001/0055878 A1 * | 12/2001 | Chooi et al. ................. 438/687 |
| 2002/0041276 A1 * | 4/2002 | Kimura ....................... 345/204 |
| 2002/0044109 A1 * | 4/2002 | Kimura ........................ 345/76 |
| 2002/0140659 A1 * | 10/2002 | Mikami et al. ............... 345/90 |
| 2002/0170968 A1 * | 11/2002 | Blake et al. ............ 235/462.11 |
| 2002/0171607 A1 * | 11/2002 | Senda et al. .................. 345/55 |
| 2002/0190256 A1 | 12/2002 | Murakami et al. |
| 2002/0196211 A1 * | 12/2002 | Yumoto ........................ 345/76 |
| 2003/0057856 A1 * | 3/2003 | Yamauchi et al. ........ 315/169.3 |
| 2003/0124042 A1 | 7/2003 | Nakazawa et al. |
| 2003/0129321 A1 | 7/2003 | Aoki |
| 2003/0214249 A1 * | 11/2003 | Kaneko et al. ........... 315/169.3 |
| 2004/0164684 A1 * | 8/2004 | Inukai et al. ............. 315/169.3 |
| 2004/0207331 A1 * | 10/2004 | Koyama ................... 315/169.3 |
| 2004/0207615 A1 * | 10/2004 | Yumoto ....................... 345/211 |
| 2005/0067968 A1 * | 3/2005 | Yamashita ................... 315/167 |
| 2005/0073241 A1 * | 4/2005 | Yamauchi et al. ........... 313/497 |
| 2005/0116747 A1 * | 6/2005 | Shimoda et al. ............. 327/108 |
| 2005/0127845 A1 * | 6/2005 | Kasai ....................... 315/169.3 |
| 2005/0195149 A1 * | 9/2005 | Ito .............................. 345/98 |
| 2006/0054893 A1 * | 3/2006 | Nathan et al. ................. 257/72 |

FOREIGN PATENT DOCUMENTS

| | | |
|---|---|---|
| CN | 1223014 A | 7/1999 |
| EP | 1 130 565 A1 | 9/2001 |
| JP | 61-138259 | 8/1986 |
| JP | 63-250873 | 10/1988 |
| JP | 02-039536 | 2/1990 |
| JP | 05-142571 | 6/1993 |
| JP | 5-249916 | 9/1993 |
| JP | 08-54836 | 2/1996 |
| JP | 08-129358 | 5/1996 |
| JP | 10-079661 | 3/1998 |
| JP | 10-170955 | 6/1998 |
| JP | 10-199827 | 7/1998 |
| JP | WO98/36407 | 8/1998 |
| JP | 10-242835 | 9/1998 |
| JP | 10-319872 | 12/1998 |
| JP | 10-319872 A | 12/1998 |
| JP | 11-111980 | 4/1999 |
| JP | 11-219146 | 8/1999 |
| JP | 11-237643 | 8/1999 |
| JP | 11-260562 | 9/1999 |
| JP | 2000-221903 | 8/2000 |
| JP | 2000-236097 | 8/2000 |
| JP | 2000-277607 | 10/2000 |
| JP | 2000-347621 | 12/2000 |
| JP | 2000-349298 | 12/2000 |
| JP | WO 01/064874 A1 | 1/2001 |
| JP | 2001-55867 | 2/2001 |
| JP | 2001-60076 | 3/2001 |
| JP | 2001-080076 A | 3/2001 |
| JP | 2001-282136 | 10/2001 |
| JP | 2001-308094 | 11/2001 |
| JP | 2001-350449 | 12/2001 |
| JP | 2002-040963 | 2/2002 |
| JP | 2003-195811 | 7/2003 |
| WO | WO 97/36324 | 10/1997 |
| WO | WO 98/36407 | 8/1998 |
| WO | WO 98/45881 | 10/1998 |
| WO | WO 01/06484 A1 | 1/2001 |
| WO | WO 01/75852 A1 | 10/2001 |

* cited by examiner

DISPLAY APPARATUS IN WHICH CHARACTERISTICS OF A PLURALITY OF TRANSISTORS ARE MADE TO DIFFER FROM ONE ANOTHER

BACKGROUND OF THE INVENTION

1. Field of the Invention

The present invention relates to a display apparatus and it particularly relates to the display apparatus which includes field-effect type transistors therein.

2. Description of the Related Art

Recently organic electro luminescent (EL) display apparatus employing organic light emitting diodes (hereinafter referred to as OLED) as luminous elements are attracting much attention as display apparatus to replace CRTs and LCDs. For example, display apparatus including field-effect transistors, such as thin film transistors (hereinafter simply referred to as TFT), as elements for driving OLEDs is a subject of intensive research and development activities. In active-matrix type organic EL display apparatus, each pixel is provided with a switching TFT which stores luminance data and thereby enables light emission even at times when luminance data are not written.

With such organic EL display apparatus, a drive margin of luminance data to be supplied to the gate electrode of an OLED driving TFT changes with the current driving capability of each driving TFT as will be described later.

On the other hand, in recent years, the apparatus incorporating semiconductor devices have been growing smaller and lighter, thus requiring the TFTs mounted thereon to be smaller. Moreover, it is expected that the power consumption of such transistors be reduced by the use of smaller TFTs.

SUMMARY OF THE INVENTION

The present invention has been made in view of the foregoing circumstances and an object thereof is to reduce variation in the luminance of light emission of a display apparatus which includes a current-driven type optical element. Another object of the present invention is to widen the drive margin of a driving transistor for an optical element. Still another object of the present invention is to prevent the operation of the driving transistor for the optical element from straying from an operation range. Still another object of the invention is to enhance the switching function of a switching transistor which sets data in a targeted element. Still another object of the invention is to realize smaller size and lower power consumption of the switching and driving transistors of display apparatus.

A preferred embodiment according to the present invention relates to a display apparatus. This display apparatus includes: a driving transistor which drives an optical element; and a switching transistor which sets data in the driving transistor, wherein characteristics of the transistors related to a current driving capability are made to differ from each another. Here, the characteristic related to a current driving capability may be, for instance, a current conversion factor, on-resistance or the like. The above-mentioned current conversion factor is a factor at which a voltage applied to a gate of a transistor is converted to a drain-source current. Thereby, the switching transistor and the driving transistor can be so designed that they have optimal characteristics related to a driving capability according to the characteristics of the display apparatus. The optical element may be organic luminescence diode. The optical element may be organic or inorganic electro luminescent.

The driving transistor and the switching transistor may be field-effect transistors, and these transistors may be formed in a manner such that gate lengths or gate widths thereof are made to differ from each other. For example, the gate length of one of the transistors is made shorter than that of the other, and/or the gate width of one of the transistors is made narrower than that of the other, so that the size of the transistor can be made smaller and the power consumption can be reduced.

The current driving capability of the driving transistor may be made smaller than that of the switching transistor. Thereby, the switching function of the switching transistor can be enhanced and the drive margin of the driving transistor can be made wider.

The driving transistor may be formed in a manner such that gate width of which is narrower than that of the switching transistor. Moreover, the switching transistor may be formed in a manner such that gate length of which is shorter than that of the driving transistor.

Moreover, the driving transistor may be formed in a manner such that gate width of the driving transistor is narrower than that of the switching transistor, and at the same time the switching transistor may be formed in a manner such that gate length of the switching transistor is shorter than that of the driving transistor. Thereby, the size of both transistors can be made smaller and the power consumption can be reduced.

The switching transistor may be comprised of a plurality of transistors which are connected in series with each other. This structure can improve a storage characteristic of the switching transistor.

Moreover, the characteristics of at least one of the plurality of transistors related to a current driving capability may be made to differ from those of other transistors. Thereby, the storage characteristics can be enhanced by the at least one of the transistors, and the other transistors can contribute to increase the current driving capability and realizing lower power consumption or smaller size.

Moreover, the display apparatus may further include a reverse-bias circuit which is connected in parallel with the optical element, wherein a voltage generated across the optical element is reversed by controlling the reverse-bias circuit at a predetermined timing.

Moreover, the display apparatus may further include a shutoff circuit which shuts off a path through which a current is supplied to the optical element, wherein the voltage generated across the optical element is reversed by controlling the reverse-bias circuit at a timing of shutting off the path.

Moreover, the optical element may be structured so that potential at one of electrodes of the optical element can be switched to higher or lower potential than that of the other of electrodes of the optical element, at a predetermined timing.

Moreover, the display apparatus may further include a shutoff circuit which shuts off a path through which a current is supplied to the optical element.

It is to be noted that any arbitrary combination of the above-described structural components and expressions changed between a method, an apparatus, a system and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
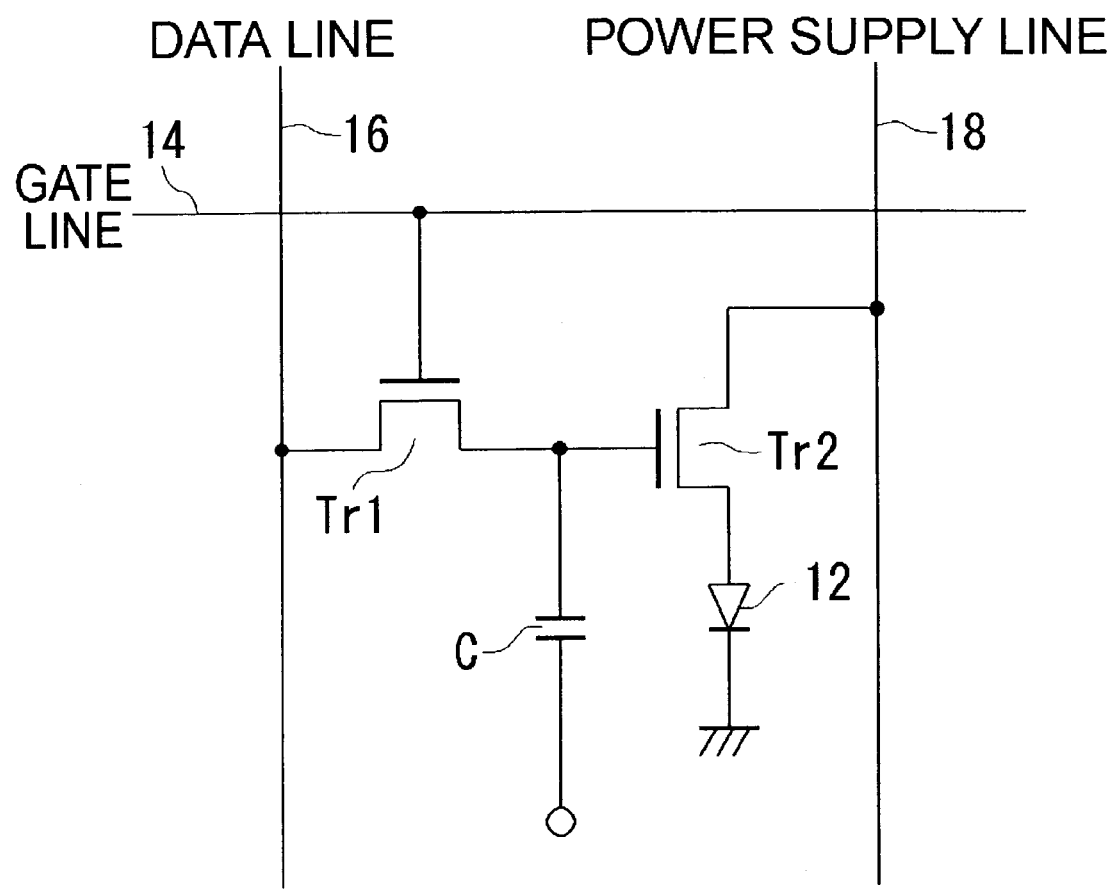
FIG. 1 is a circuit diagram showing a part of a display apparatus according to a first embodiment of the present invention.

FIG. 1 is a circuit diagram showing a part of a display apparatus according to a first embodiment of the present invention. In the first embodiment, a display apparatus 10 includes a switching transistor Tr1, a driving transistor Tr2, a capacitor C and a diode 12. The diode 12 is, for instance, an organic EL optical element that functions as a luminous element.

The driving transistor Tr2 is a TFT, which controls a drive current flowing to the diode 12. The switching transistor Tr1 is also a TFT, which serves as a switch to set data in the driving transistor Tr2.

As for the switching transistor Tr1, a gate electrode thereof is connected to a gate line 14, a drain electrode (or a source electrode) of the switching transistor Tr1 is connected to a data line 16, and the source electrode (or the drain electrode) thereof is connected to a gate electrode of the driving transistor Tr2 and one of the electrodes of the capacitor C. The other of the electrodes of the capacitor C is set at a predetermined potential. The data line 16, which is connected to a constant-voltage source (not shown), transmits luminance data that will determine the current flowing to the diode 12.

As for the driving transistor Tr2, a drain electrode thereof is connected to a power supply line 18 and a source electrode of the driving transistor Tr2 is connected to an anode electrode of the diode 12. A cathode electrode of the diode 12 is grounded. The power supply line 18 is connected to a power supply (not shown), and a predetermined voltage is applied thereto.

Figure 2A:
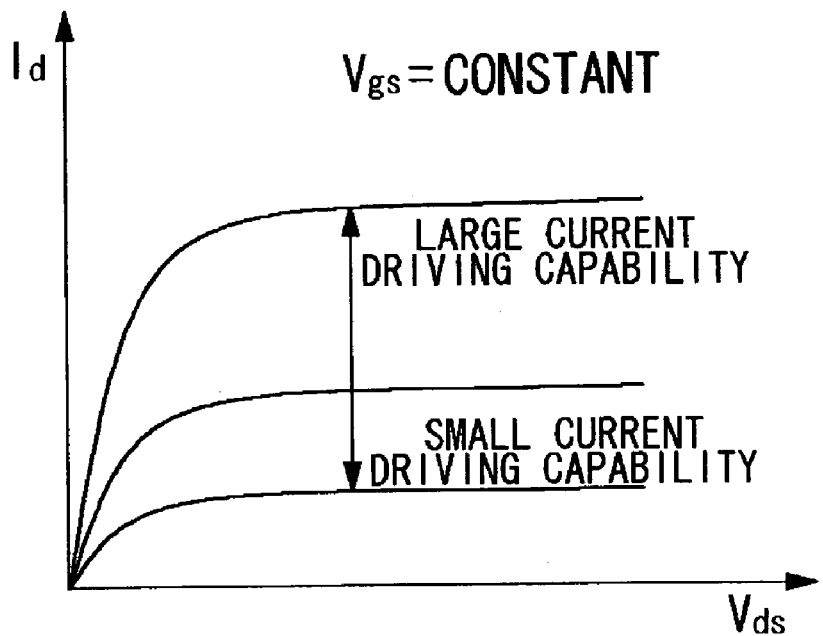
FIGS. 2A and 2B are graphs showing characteristics of transistors in the display apparatus shown in FIG. 1.
Figure 2B:
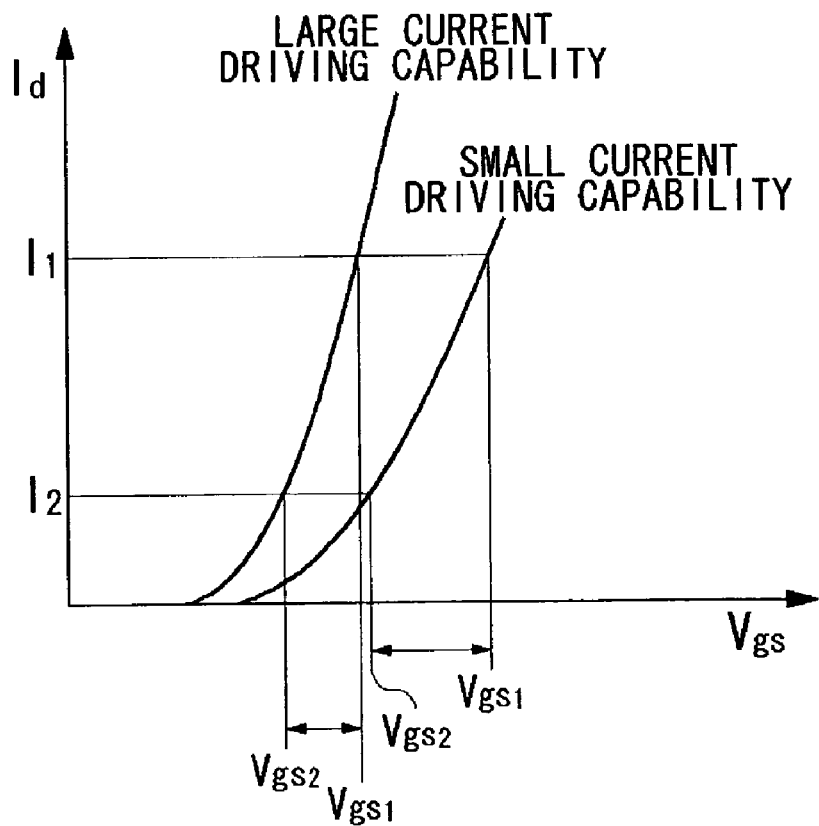

FIGS. 2A and 2B are graphs showing the characteristics of the transistors in the display apparatus shown in FIG. 1. FIG. 2A shows a relationship between a drain-source voltage $V_{ds}$ of a plurality of driving transistors Tr2 having different current driving capabilities and the value of current Id that flows to the diode 12. It is shown here that the smaller the current driving capability of the driving transistor Tr2, the wider the saturation region of the transistor will be and furthermore the smaller the saturation current value will be.

FIG. 2B shows a relationship between a gate-source voltage $V_{gs}$ of two driving transistors Tr2 having different current driving capabilities and the value of current $I_d$ that flows to the diode 12. It is shown here that the smaller the current driving capability of the driving transistor Tr2, the wider the margin between a gate-source voltage $V_{gs1}$ required to send a certain current $I_1$ to the diode 12 and a gate-source voltage $V_{gs2}$ required to send another current $I_2$ to the diode 12 will be.

As is described above, the smaller the current driving capability of the driving transistor Tr2, the greater the drive margin of luminance data to be supplied to the gate electrode of the drive transistor Tr2 will be.

Referring back to FIG. 1, according to the present embodiment, the driving transistor Tr2 is designed to have a smaller current driving capability than that of the switching transistor Tr1. The current driving capability is expressed, for instance, by a current conversion factor β such that $β=μ(C0x/2)×(W/L)$ where μ is the effective mobility of a carrier, C0x is a gate oxide film capacity per unit area, W is a gate width, and L is a gate length. In this first embodiment, the switching transistor Tr1 and the driving transistor Tr2 are so formed as to have different gate lengths or gate widths from each other. Thus, the current conversion factor of the driving transistor Tr2 can be made smaller than that of the switching transistor Tr1.

According to the first embodiment, in order to make the current conversion factor of the driving transistor Tr2 smaller than that of the switching transistor Tr1, a value of W/L in the driving transistor Tr2 needs to be smaller than that in the switching transistor Tr1. In order to actualize this condition, for example: (1) The gate width of the driving transistor Tr2 is made narrower than that of the switching transistor Tr1; (2) The gate length of the switching transistor Tr1 is made shorter than that of the driving transistor Tr2; and so forth.

The merits of each of the above arrangements are described below:

(1) By making the gate width of the driving transistor Tr2 narrower than that of the switching transistor Tr1, the drive margin can be made larger by lowering the current driving capability of the driving transistor Tr2 in addition to a merit that the driving transistor Tr2 can be made smaller size and lower power consumption.

(2) By making the gate length of the switching transistor Tr1 shorter than that of the driving transistor Tr2, switching function of the switching transistor Tr1 can be raised in addition to a merit that the switching transistor Tr1 can be made smaller size and lower power consumption.

Moreover, for example, the arrangements of (1) and (2) may be combined with each other. Such a combination realizes smaller sizes for both the transistors and lowered power consumption resulting from reduced gate capacitance.

In the present embodiment described above, arrangements are made toward making transistors smaller, but improvements can be made by other arrangements as well. For example, the saturation region, namely, the operation range, of the driving transistor Tr2 can be widened by making the current driving capability of the driving transistor Tr2 smaller than that of the switching transistor Tr1. Moreover, by widening the operation range of the driving transistor by making the drive margin thereof larger to make the operation range wider, variation in luminance among the optical elements included in the display apparatus can be reduced. Moreover, gradation control by the control of luminance can be carried out with greater accuracy. With these arrangements with these advantageous effects, the reliability of the transistors can be improved.

Second Embodiment

Figure 3:
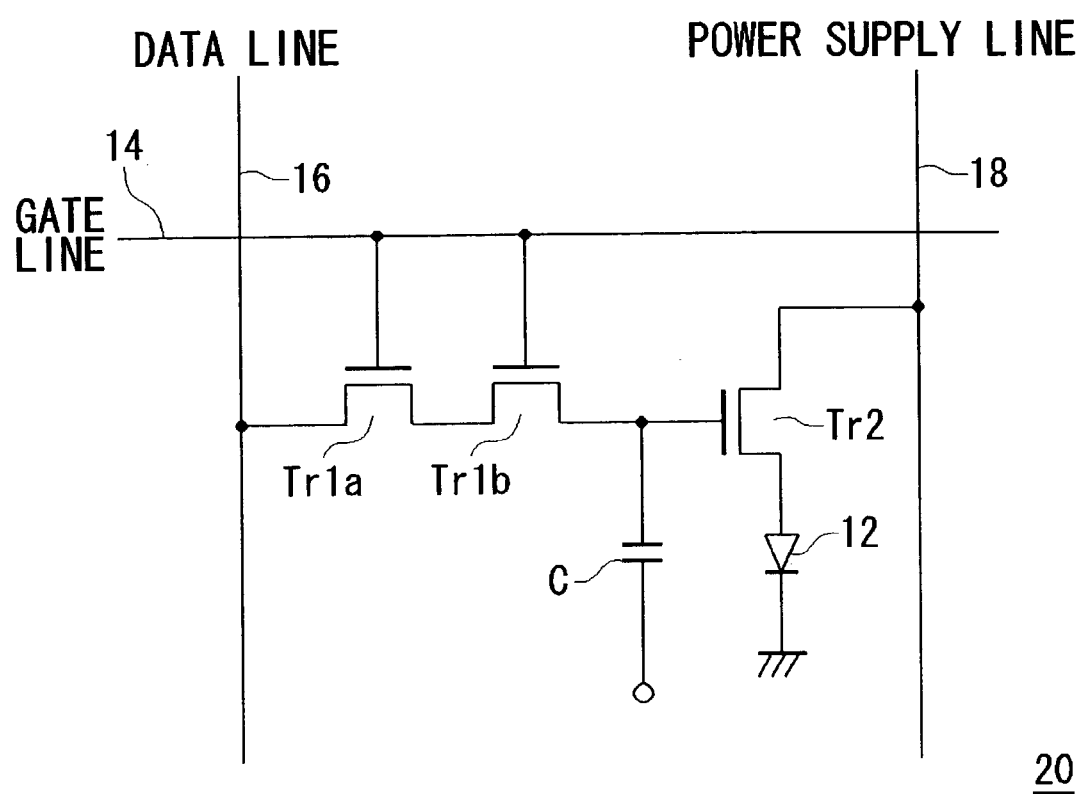
FIG. 3 is a circuit diagram showing a part of a display apparatus according to a second embodiment of the present invention.

FIG. 3 is a circuit diagram showing a part of a display apparatus according to a second embodiment of the present invention.

In this second embodiment, a display apparatus 20 differs from the first embodiment in that the display apparatus 20 has two switching transistors, a first switching transistor Tr1$a$ and a second switching transistor Tr1$b$, connected in series with each other. In FIG. 3, components identical to those in the first embodiment are denoted by the same reference numerals, of which description will be omitted as appropriate. It is to be noted that in this second embodiment the first switching transistor Tr1 a is substantially the same as the second switching transistor Tr1$b$.

As for the first switching transistor Tr1$a$, a gate electrode thereof is connected to a gate line 14, a drain electrode (or a source electrode) thereof is connected to a data line 16, and the source electrode (or the drain electrode) thereof is connected to a drain electrode (or a source electrode) of the second switching transistor Tr21$b$. As for the second switching transistor Tr1$b$, a gate electrode thereof is connected to the gate line 14, and the source electrode (or the drain electrode) thereof is connected to a gate electrode of a driving transistor Tr2 and one of the electrodes of a capacitor C.

In the second embodiment, the driving transistor Tr2 is designed to have a smaller current driving capability than that of the first switching transistor Tr1$a$ and the second switching transistor Tr1$b$ combined. For example, it is so designed as to be $(1/\beta 1a+1/\beta 1b)<1/\beta 2$, where $\beta 1a$ is the current conversion factor of the first switching transistor Tr1$a$, $\beta 1b$ is the current conversion factor of the second switching transistor Tr1$b$, and $\beta 2$ is the current conversion factor of the driving transistor Tr2.

For example, there may be two arrangements to make the current conversion factor of the driving transistor Tr2 smaller than that of the two switching transistors Tr1$a$ and Tr1$b$ combined: (1) The gate width of the driving transistor Tr2 is made narrower than half of the gate width of the switching transistor Tr1$a$ or Tr1$b$ (provided, however, that the gate lengths of these three transistors Tr2, Tr1$a$ and Tr1$b$ are substantially the same); (2) The gate length of the switching transistor Tr1$a$ or Tr1$b$ is made shorter than half of the gate length of the driving transistor Tr2 (provided, however, that the gate widths of these three transistors Tr2, Tr1$a$ and Tr1$b$ are substantially the same); and so forth. As another examples, there will be any arbitrary designing available if $(1/\beta 1a+1/\beta 1b)<1/\beta 2$ is satisfied.

According to the second embodiment, the switching transistor is made up of two transistors Tr1$a$ and Tr1$b$ which are connected in series with each other, so that the storage characteristics of the switching transistor can be improved. Also, as for the consideration of characteristics related to a driving capability of the driving transistor Tr2 is same in this embodiment as the first embodiment.

Third Embodiment

A third embodiment according to the present invention differs from the second embodiment in that the first switching transistor Tr1$a$ and the second switching transistor Tr1$b$ are so structured as to have different characteristics related to a driving capability, such as the current conversion factor.

In the third embodiment, there are, for example, the following arrangements to make the current conversion factor of the driving transistor Tr2 smaller than that of the two switching transistors Tr1$a$ and Tr1$b$ combined: (1) The gate width of the driving transistor Tr2 is made narrower than $(W1a \times W1b)/(W1a+W1b)$, where W1$a$ is the gate width of the first switching transistor Tr1$a$ and W1$b$ is the gate width of the second switching transistor Tr1$b$ (provided, however, that the gate lengths of these three transistors Tr1$a$, Tr1$b$ and Tr2 are substantially the same); (2) The sum of the gate lengths of the two switching transistors Tr1$a$ and Tr1$b$ is made shorter than the gate length of the driving transistor Tr2 (provided, however, that the gate widths of these three transistors Tr1$a$, Tr1$b$ and Tr2 are substantially the same); and so forth.

The third embodiment may be so arranged as to have a greater effect on reducing the leakage current, for instance, by setting the current conversion factor of the second switching transistor Tr1$b$, which is closer to the driving transistor Tr2, lower than that of the first switching transistor Tr1$a$. Moreover, by thus differentiating the characteristics related to a driving capability of a plurality of switching transistors, the storage characteristics of at least one of the transistors can be raised while the current driving capability of the other transistor or transistors can be increased, the power consumption thereof can be lowered or the size thereof can be made smaller. Also, as for the consideration of characteristics related to a driving capability of the driving transistor Tr2 is same in this embodiment as the first embodiment.

The present invention has been described based on embodiments which are only exemplary. It is understood by those skilled in the art that there exist other various modifications to the combination of each component and process described above and that such modifications are encompassed by the scope of the present invention. Such modified examples will be described hereinbelow.

In the above embodiments, arrangements have been described where the current driving capability of the driving transistor Tr2 is made smaller than that of the switching transistor Tr1. Conversely, however, an arrangement may also be employed where the current driving capability of the driving transistor Tr2 is made larger than that of the switching transistor Tr1. For example, in a case where this display apparatus is used for a PDA or portable telephone which is characterized by relatively low speed operation environment, the switching function of the switching transistor Tr1 is not particularly important, so that an arrangement whereby the leakage current is reduced may be adopted by lowering the current driving capability of the switching transistor Tr1.

In the above embodiments, the characteristics related to a driving capability of the switching and driving transistors are differentiated by changing the design of the gate length or the gate width of the transistors. However, the characteristics related to a driving capability of these transistors may also be differentiated by changing the thickness of a gate insulator or changing an ion dose into the gate electrode thereof.

In the above embodiments, the switching transistors Tr1, Tr1a and Tr1b and the driving transistor Tr2 have been represented as n-channel transistors, but they may be p-channel transistors or a combination of p-channel and n-channel transistors.

In the second and third embodiments, the switching transistor comprises two transistors Tr1a and Tr1b connected in series with each other, but it may also comprise three or more transistors.

The diode may be inorganic electro luminescent, although it has been explained as organic electro luminescent in the above embodiments.

Figure 4:
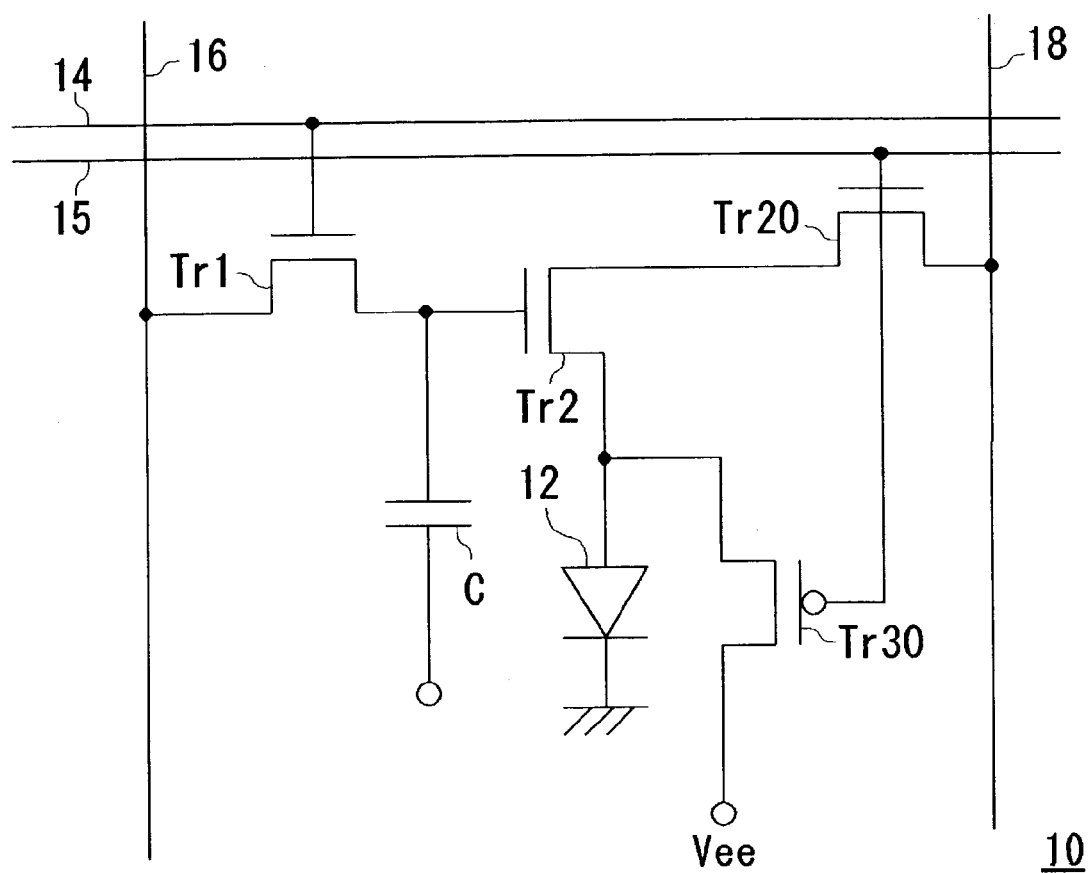
FIG. 4 is a circuit diagram where a reverse-bias circuit is further implemented to the display apparatus.

Moreover, for example, the display apparatus 10 shown in FIG. 1 may further include a shutoff transistor Tr20 which serves as a shutoff circuit and a reverse-biasing transistor Tr30 which serves as a reverse-bias circuit, as shown in FIG. 4. In this case, a control signal line 15 is provided in the display apparatus 10. The control signal line 15 sends a control signal by which to activate the shutoff transistor Tr20 at a timing of shutting off a diode 12 from the power supply line 18. The shutoff transistor Tr20 operates as a switch that shuts off a path between the shutoff the power supply line 18 and the diode 12.

Here, the drain electrode of the driving transistor Tr2 is connected to a source electrode of the shutoff transistor Tr20, and the source electrode of the driving transistor Tr2 is connected to the anode electrode of the diode 12. A gate electrode of the shutoff transistor Tr20 is connected to the control signal line 15, and a drain electrode of the shutoff transistor Tr20 is connected to the power supply line 18.

An operation procedure for the circuit thus structured as above will be described hereinbelow. As a scanning signal of the gate line 14 goes high, the switching transistor Tr1 turns on. As a control signal of the control signal line 15 goes high, the shutoff transistor Tr20 turns on. Consequently, the source electrode of the driving transistor Tr2 conducts to the power supply line 18. The potential at the data line 16 becomes the same as the gate potential of the driving transistor Tr2. Thus, a current corresponding to a gate-source voltage of the driving transistor Tr2 flows between the power supply line 18 and the anode electrode of the diode 12, so that the diode 12 emits light at light intensity corresponding to the current amount. As the control signal of the control signal line 15 goes low, the shutoff transistor Tr20 turns off and the path between the diode 12 and the power supply line 18 is shut off. Thus, the diode 12 turns off irrespective of luminance data set in the gate electrode of the driving transistor Tr2.

Here, a source electrode of the reverse-biasing transistor Tr30 may be connected to negative potential Vee which is lower than the ground potential to which the cathode electrode of the diode 12 is connected. In such a structure, as the control signal line 15 turns low, the shutoff transistor Tr20 turns off and the reverse-biasing transistor Tr30 turns on. Then, potential at the anode electrode of the diode 12 becomes the same as the negative potential Vee. As the cathode electrode of the diode 12 is ground potential, and the potential at the cathode electrode becomes higher than the potential at the anode electrode, the diode 12 is in a reverse-bias applied state.

By putting the diode 12 in the reverse-bias applied state accordingly, the electric charge remaining in the diode 12 can be pulled out and a residual image phenomenon can be suppressed. At the same time, the characteristics of an organic film constituting the diode 12 can be recovered. As a general problem, the diode such as an OLED suffers deterioration of the organic film, namely, luminance degradation if used for long period of time, and the deterioration is conspicuous compared to other optical elements utilizing liquid crystals or the like. Thus, by setting the OLED in the reverse-bias applied state during an update period of luminance data, the display quality thereof is prevented from being reduced and at the same time the proper characteristics of the organic film can be restored.

Figure 5:
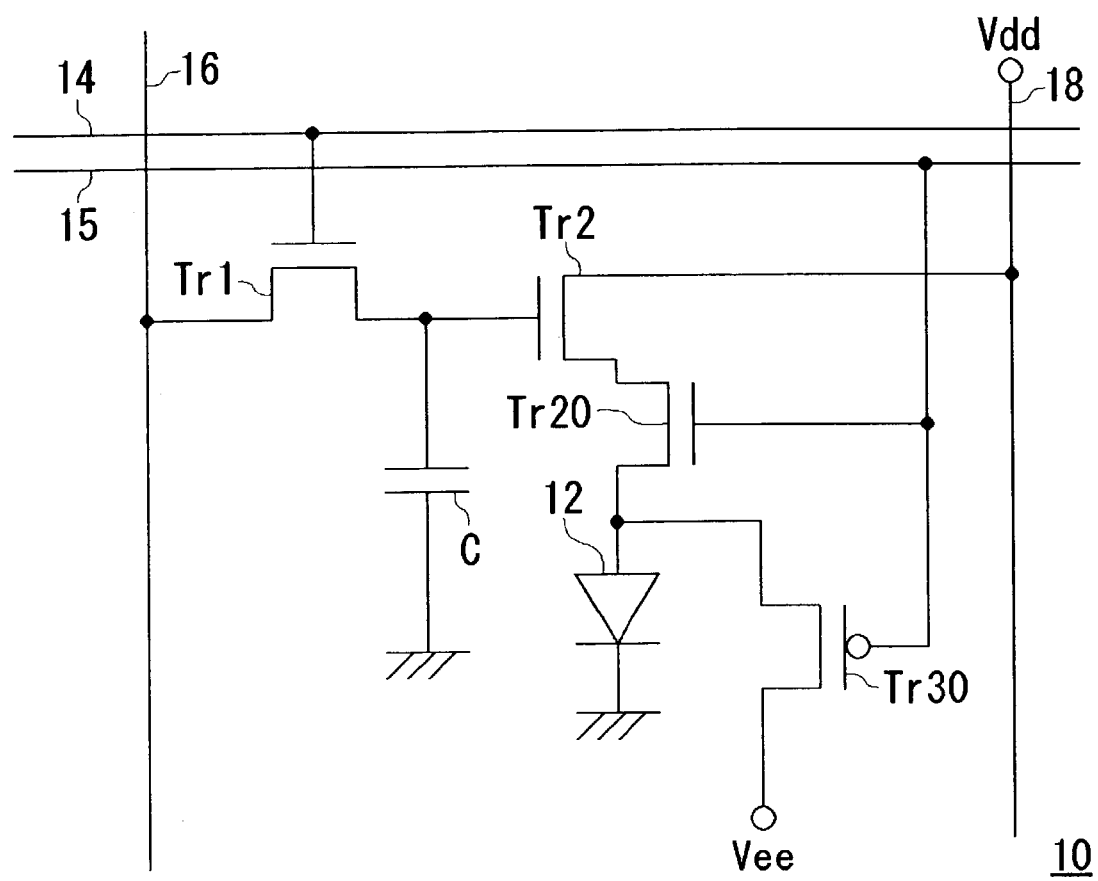
FIG. 5 shows a modified example of the display apparatus shown in FIG. 4.

Moreover, referring to FIG. 5, the display apparatus may be so structured that the shutoff transistor Tr20 is disposed between the driving transistor Tr2 and the diode 12. Namely, the source electrode of the shutoff transistor Tr20 is connected to the anode electrode of the diode 12 whereas the drain electrode of the shutoff transistor Tr20 is connected to the source electrode of the driving transistor Tr2. Similar to the example shown in FIG. 4, the shutoff transistor Tr20 turns on as the control signal of the control signal line 15 goes high whereas the shutoff transistor Tr20 turns off as the control signal of the control signal line 15 goes low. The operation and its timing for the circuit structured as in FIG. 5 are similar to those of the circuit shown in FIG. 4.

In the display apparatuses shown in FIG. 4 and FIG. 5, the shutoff transistor Tr20 and the reverse-biasing transistor Tr30 are on-off controlled by control signal line 15, not by the gate line 14. However, the arrangement is not limited thereto, and the shutoff transistor Tr20 and the reverse-biasing transistor Tr30 may be on-off controlled by the gate line 14, instead.

Figure 6:
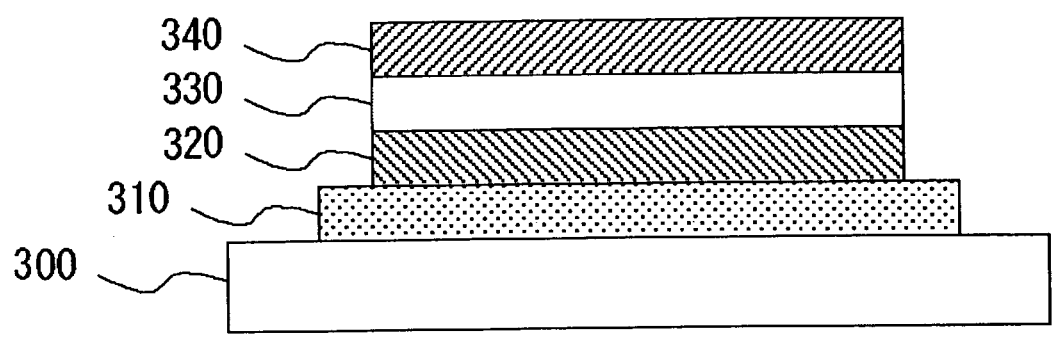
FIG. 6 shows a general multi-layer structure of an organic light emitting diode.
Figure 7:
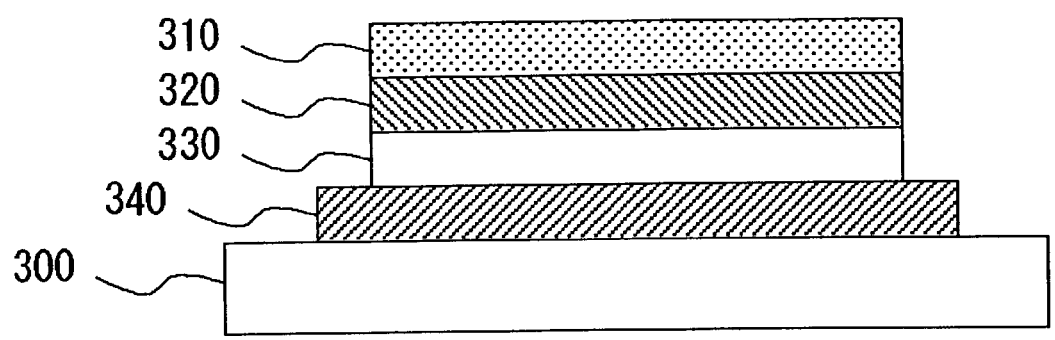
FIG. 7 shows another multi-layer structure where each element thereof is stacked in the reverse order compared to the general multi-layer structure of the organic light emitting diode shown in FIG. 6.

In general, a multi-layer structure of the diode 12 such as an OLED is such that an anode layer 310, a hole transporting layer 320, an organic EL layer 330 and a cathode layer 340 are stacked, in this order from the bottom to the top thereof, on an insulating substrate such as a glass substrate 300, as shown in FIG. 6. The multi-layer structure of the OLED is not limited to that shown in FIG. 6, and may be such that a cathode layer 340, an organic EL layer 330, a hole transporting layer 320 and an anode layer 310 are stacked, in this order from the bottom to the top thereof, on an insulating substrate such as a glass substrate 300, as shown in FIG. 7. If the multi-layer structure of the OLED is the one as shown in FIG. 6, a cathode electrode of the OLED is connected to ground potential which is fixed potential.

However, if the multi-layer structure of the OLED is the one as shown in FIG. 7, an anode electrode of the OLED is connected to the fixed potential.

Figure 8:
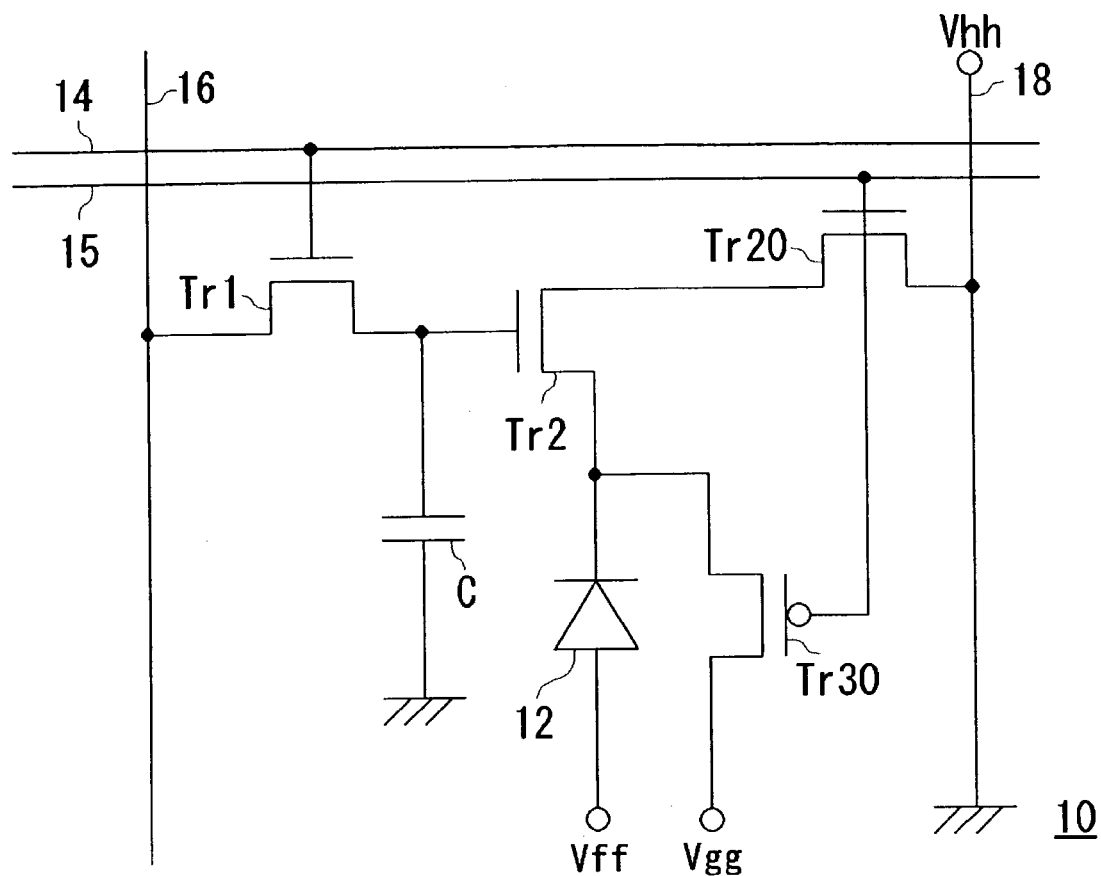
FIG. 8 shows a structure where the anode and cathode electrodes of the diode shown in the display apparatus of FIG. 4 are replaced with the cathode and anode electrodes, respectively, and the anode electrode is connected to a power supply potential Vff which is both positive potential and fixed potential.
Figure 9:
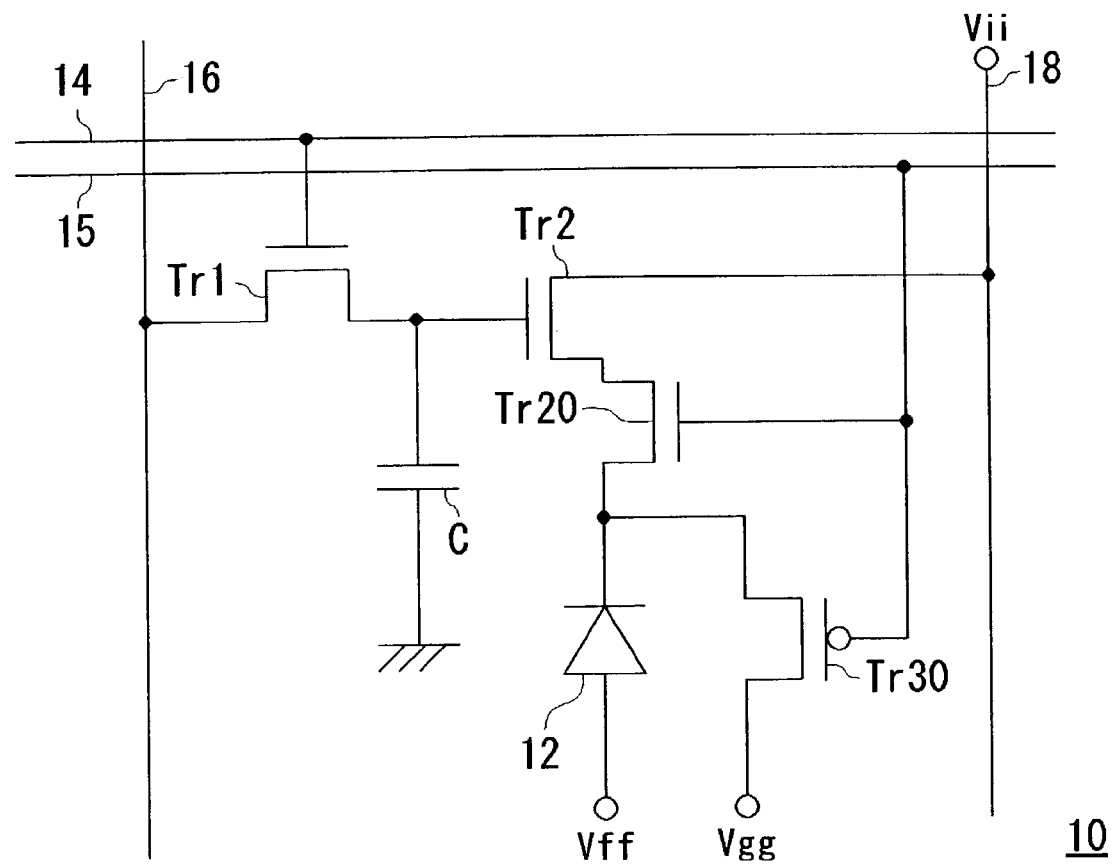
FIG. 9 shows a structure where the anode and cathode electrodes of the diode shown in the display apparatus of FIG. 5 are replaced with the cathode and anode electrodes, respectively, and the anode electrode is connected to a power supply potential Vff which is a fixed potential.
Figure 10:
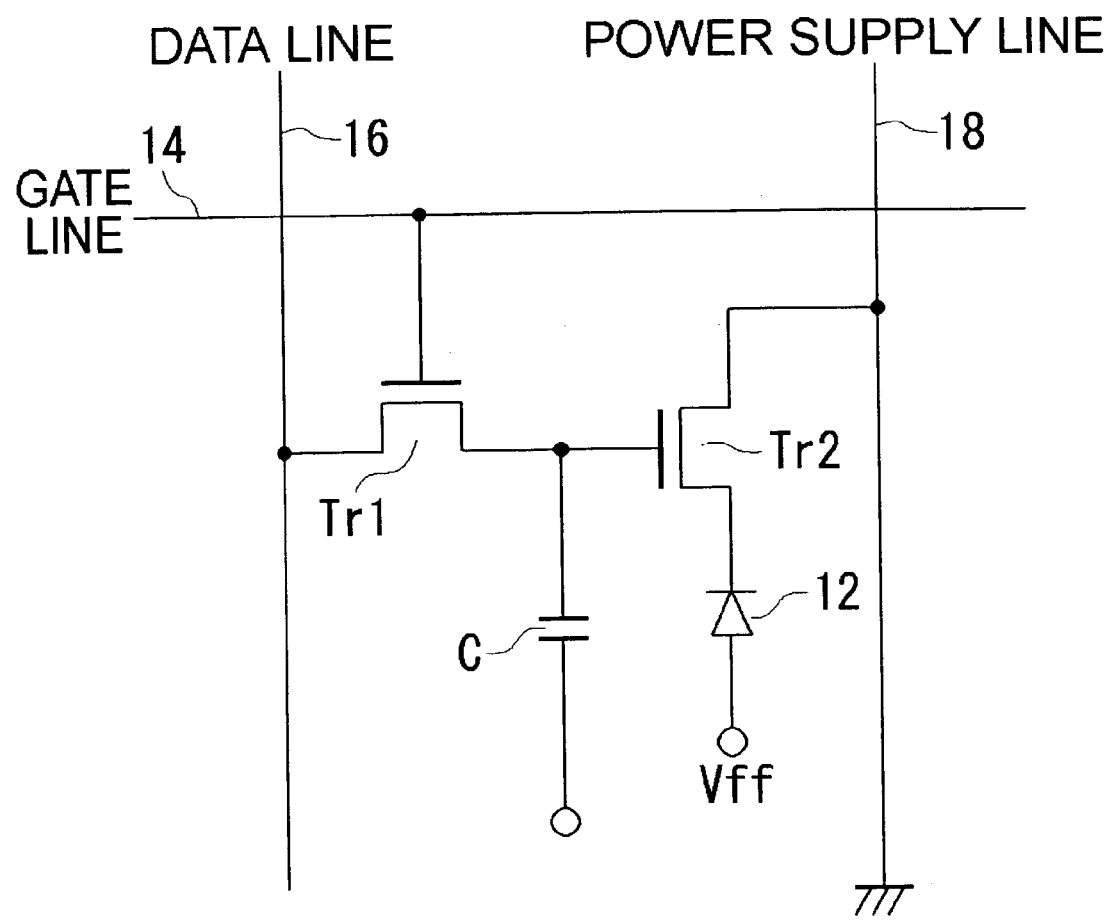
FIG. 10 is a modified circuit diagram over that of FIG. 1 where the organic light emitting diode has a multi-layer structure as shown in FIG. 7.
Figure 11:
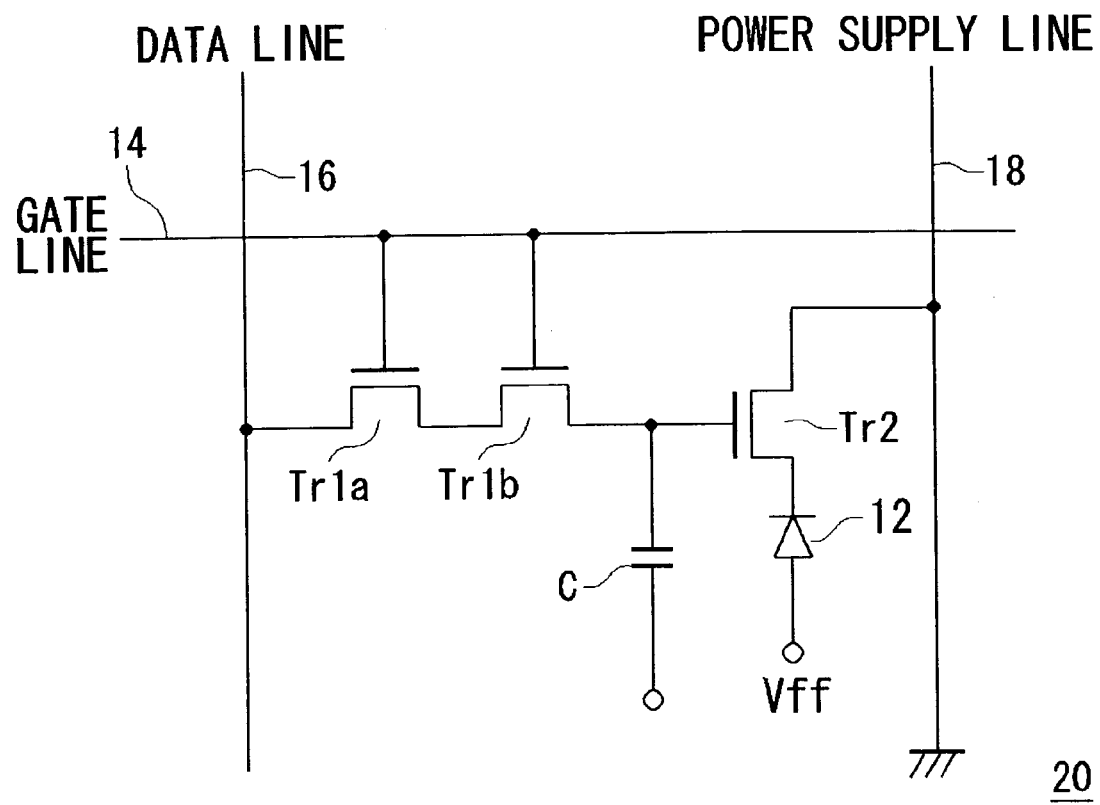
FIG. 11 is a modified circuit diagram over that of FIG. 3 where the organic light emitting diode has a multi-layer structure as shown in FIG. 7.

FIGS. 8 to 11 are examples of the display apparatus suitable for the OLEDs having such multi-layer structures. In a case where the multi-layer structure of the OLED is as shown in FIG. 7, the display apparatus 10 shown in FIG. 1 will be structured as shown in FIG. 10. Here, compared to FIG. 1, the anode electrode of the diode 12 is replaced with the cathode electrode thereof, and the anode electrode of the diode 12 is now connected to the power supply potential Vff which is positive potential and fixed potential. In a similar manner, if the multi-layer structure of the OLED is as shown in FIG. 3, the display apparatus 20 shown in FIG. 3 will be structured as shown in FIG. 11.

During the emission time of the diode 12, the current flows from the power supply potential Vff to the power supply line 18 which is ground potential, by way of the diode 12 and the driving transistor Tr2.

FIG. 8 shows a structure where the anode and cathode electrodes of the diode 12 shown in the display apparatus 10 of FIG. 4 are replaced with the cathode and anode electrodes thereof, respectively, so that the anode electrode thereof is connected to a power supply potential Vff which is positive potential and fixed potential. Moreover, the electrode, connected to the negative potential Vee, of the reverse-biasing transistor Tr30 is now connected to a positive potential Vgg which is higher than the power supply potential Vff. Moreover, the electrode, connected to the power supply line 18, of the shutoff transistor Tr20 is now connected to a low potential line Vhh which is ground potential.

During the emission time of the diode 12, the current flows from the power supply potential Vff to the low potential line Vhh which is ground potential, by way of the driving transistor Tr2 and the shutoff transistor Tr20. Then, the shutoff transistor Tr20 turns on and the reverse-biasing transistor Tr30 turns off by turning the control signal line 15 low. As the control signal line 15 is turned low during the luminance-data update period of the diode 12, the shutoff transistor Tr20 turns off and the reverse-biasing transistor Tr30 turns on. As a result, the potential at the cathode electrode of the diode 12 becomes positive potential Vgg which is higher than the power supply potential Vff, so that the diode 12 becomes reverse-biased.

FIG. 9 shows a structure where the anode and cathode electrodes of the diode 12 shown in the display apparatus of FIG. 5 are replaced with the cathode and anode electrodes thereof, respectively, so that the anode electrode thereof is connected to a power supply potential Vff which is fixed potential. The power supply line 18 (positive potential) to which the driving transistor Tr2 is connected as shown in FIG. 5 is now changed to a negative potential line Vii which is of negative potential. Moreover, the electrode, connected to the negative potential Vee, of the reverse-biasing transistor Tr30 is now connected to a positive potential Vgg which is higher than the ground potential. As the control signal line 15 is turned high during the luminance-data update period of the diode 12, the reverse-biasing transistor Tr30 turns on and the shutoff transistor Tr12 turns off. At this time, the potential at the cathode electrode of the diode 12 becomes a positive potential Vgg which is higher than the power supply potential Vff that represents the potential at the anode electrode thereof, so that the diode 12 is in a reverse-bias applied state.

In the display apparatuses shown in FIGS. 8 and 9, the shutoff transistor Tr20 and the reverse-biasing transistor Tr30 are on-off controlled the control signal line 15, not by the gate line 14. However, the arrangement is not limited thereto, and the shutoff transistor Tr20 and the reverse-biasing transistor Tr30 may be on-off controlled by the gate line 14 instead. In such a case, it is preferable that the structure of transistors be of a type such that the shutoff transistor Tr20 turns off and the reverse-biasing transistor Tr30 turns on while the luminance data is being set in the driving transistor Tr2.

It is to be noted that the display apparatus 20 shown in FIG. 3 may be structured such that a shutoff circuit and a reverse-bias circuit are further provided as in the display apparatus of FIG. 1 with the shutoff circuit Tr20 and the reverse-bias circuit Tr30. Moreover, the circuit structure as shown in FIG. 8 and FIG. 9 may be implemented into the display apparatus 20 shown in FIG. 3.

Although the present invention has been described by way of exemplary embodiments, it should be understood that many changes and substitutions may further be made by those skilled in the art without departing from the scope of the present invention which is defined by the appended claims.

What is claimed is:

1. A display apparatus, including:
   a driving transistor which drives an optical element; and
   a switching transistor which is fed a control signal at its gate and sets data in said driving transistor in accordance with the control signal,
   wherein: characteristics of said transistors related to a current driving capability are made to differ from each other;
   the characteristic of said driving transistor related to a current driving capability is smaller than that of said switching and
   said switching transistor is comprised of n transistors (n being an integer greater than or equal to two), connected in series with each other, whose characteristics related to a driving capability are substantially equal to each other, wherein gate length of said switching transistor is substantially equal to that of said driving transistor, and wherein said driving transistor is formed in a manner such that gate width of which is narrower than 1/n of that of a transistor constituting said switching transistor.

2. A display apparatus according to claim 1, wherein the characteristic of said transistors related to a current driving capability is a current conversion factor.

3. A display apparatus according to claim 1, wherein said driving transistor and said switching transistor are field-effect transistor, and said transistors are formed in a manner such that gate widths of said transistors are made to differ from each other.

4. A display apparatus according to claim 1, wherein said driving transistor and said switching transistor are field-effect transistors, and said transistors are formed in a manner such that gate lengths of said transistors are made co differ from each other.

5. A display apparatus according to claim 1, wherein said driving transistor is formed in a manner such that gate width of which is narrower than that of said switching transistor.

6. A display apparatus according to claim 1, wherein said switching transistor is formed in a manner such that gate length of which is shorter than that of said driving transistor.

7. A display apparatus according to claim 1, wherein said driving transistor is formed in a manner such that gate width of said driving transistor is narrower than that of said switching transistor, and said switching transistor is formed in a manner such that gate length of said switching transistor is shorter than that of said driving transistor.

8. A display apparatus according to claim 1, wherein the characteristic of said driving transistor related to a current driving capability is larger than that of said switching transistor.

9. A display apparatus according to claim 1, wherein said switching transistor is comprised of a plurality of transistors which are connected in series with each other.

10. A display apparatus according to claim 9, wherein characteristics of at least one of said plurality of transistors related to a current driving capability are made to differ from those of other transistors.

11. A display apparatus according to claim 9, wherein the characteristic related to a current driving capability is a current conversion factor.

12. A display apparatus according to claim 9, wherein the plurality of transistors which constitute said switching transistor are provided between a data supply source and said switching transistor, and a characteristic related to a current driving capability, of the transistor provided at a side of the data supply source is larger than that of the transistor provided at a side of said switching transistor.

13. A display apparatus according to claim 1, wherein said switching transistor is comprised of n transistors (n being an integer greater than or equal to two), connected in series with each other, whose characteristics related to a driving capability are substantially equal to each other, wherein gate width of said switching transistor is substantially equal to that of said driving transistor, and wherein a transistor that constitute said switching transistor is formed in a manner such that gate length of which is shorter than 1/n of that of said driving transistor.

14. A display apparatus according to claim 1, wherein the optical element is an organic light emitting diode.

15. A display apparatus according to claim 1, further including a reverse-bias circuit which is connected in parallel with the optical element, wherein a voltage generated across the optical element is reversed by controlling said reverse-bias circuit at a predetermined timing.

16. A display circuit according to claim 15, further including a shutoff circuit which shuts off a path through which a current is supplied to the optical element, wherein the voltage generated across the optical element is reversed by controlling said reverse-bias circuit at a timing of shutting off the path.

17. A display apparatus according to claim 1, wherein the optical element is structured so that potential at one of electrodes of the optical element can be switched to higher or lower potential than that of the other of electrodes of the optical element, at a predetermined timing.

18. A display apparatus according to claim 1, further including a shutoff circuit which shuts off a path through which a current is supplied to the optical element.

* * * * *

UNITED STATES PATENT AND TRADEMARK OFFICE
CERTIFICATE OF CORRECTION

PATENT NO. : 7,215,304 B2  Page 1 of 1
APPLICATION NO. : 10/359571
DATED : May 8, 2007
INVENTOR(S) : Hiroshi Tsuchiya et al.

It is certified that error appears in the above-identified patent and that said Letters Patent is hereby corrected as shown below:

Page 2 of Title page, item "(56) References Cited", under "FOREIGN PATENT DOCUMENTS", delete "JP   WO 01/064874 A1    1/2001";

Change "JP     2001-55867    2/2001" to --JP   2001-56667    2/2001--;

Change "JP     2001-080076 A    3/2001" to --JP   2001-060076 A   3/2001--

Signed and Sealed this

Second Day of October, 2007

JON W. DUDAS
*Director of the United States Patent and Trademark Office*